(12) United States Patent
Itou et al.

(10) Patent No.: US 6,914,288 B2
(45) Date of Patent: Jul. 5, 2005

(54) EEPROM AND EEPROM MANUFACTURING METHOD

(75) Inventors: Hiroyasu Itou, Nagoya (JP);
Mitsutaka Katada, Hoi-gun (JP);
Hidetoshi Muramoto, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/660,682

(22) Filed: Sep. 12, 2003

(65) Prior Publication Data

US 2004/0070022 A1 Apr. 15, 2004

(30) Foreign Application Priority Data

Oct. 9, 2002 (JP) .......................... 2002-296066

(51) Int. Cl.[7] .................. H01L 21/336; H01L 29/76; H01L 29/788
(52) U.S. Cl. .................. 257/314; 257/315; 257/316; 257/317; 257/318; 257/319; 438/257
(58) Field of Search .................. 257/314–326; 438/257

(56) References Cited

U.S. PATENT DOCUMENTS

| 4,377,857 A | 3/1983 | Tickle .................. 365/185.33 |
| 4,477,825 A | 10/1984 | Yaron et al. |
| 4,794,562 A | 12/1988 | Kato et al. |
| 6,157,058 A | 12/2000 | Ogura .................. 257/315 |
| 6,291,851 B1 | 9/2001 | Matsumoto et al. ........ 257/314 |
| 6,323,517 B1 | 11/2001 | Park et al. .................. 257/326 |

FOREIGN PATENT DOCUMENTS

| JP | A-59-205763 | 11/1984 |
| JP | A-61-181168 | 8/1986 |

OTHER PUBLICATIONS

Lucero, et al., "A 16 kbit Smart 5 V–Only EEPROM with Redundancy," *IEEE Journal of Solid–State Circuits*, vol. SC–18, No. 5, Oct. 1983, pp. 539–544.

*Primary Examiner*—Tom Thomas
*Assistant Examiner*—Jesse A. Fenty
(74) *Attorney, Agent, or Firm*—Posz Law Group, PLC

(57) ABSTRACT

A memory transistor of an EEPROM has a floating gate electrode of a shape such that it covers the entirety of a tunnel film and a channel region and does not cover a region between the channel region and an embedded layer. And, a control gate electrode is formed on an interlayer insulating film on the floating gate electrode into a shape such that it is wider than the floating gate electrode above the tunnel film, and is narrower than the floating gate electrode above the channel region.

9 Claims, 14 Drawing Sheets

EEPROM AND EEPROM MANUFACTURING METHOD

CROSS REFERENCE TO RELATED APPLICATION

This application is related to and incorporates herein by reference Japanese Patent Applications No. 2002-296066 filed on Oct. 9, 2002.

FIELD OF THE INVENTION

This invention relates to an electrically programmable and electrically erasable floating gate type nonvolatile memory device, and particularly to an EEPROM (Electrically Erasable Programmable Read Only Memory) in which overwriting is carried out using a Fowler Nordheim tunnel effect, and to a manufacturing method thereof.

BACKGROUND OF THE INVENTION

The construction of an EEPROM proposed in related art is shown in FIG. 19. The EEPROM shown in FIG. 19 has a memory transistor and a select transistor for selecting this memory transistor at times of memory overwriting and reading.

In a region of the memory transistor, an embedded N-type layer 32 corresponding to a drain region and an N+-type source layer 42 are formed in a superficial layer of a semiconductor substrate 31. Also, a gate oxide film 33 is formed on the surface of the semiconductor substrate 31 and a tunnel film 34 is formed above the embedded N-type layer 32. A floating gate electrode 35, an interlayer insulating film 36 and a control gate electrode 37 are formed extending from above the tunnel film 34 to above the region between the embedded N-type layer 32 and the source layer 42.

In a region of the select transistor, a gate electrode 38 is formed on the gate oxide film 33 on the semiconductor substrate 31. And in the superficial layer of the semiconductor substrate 31 at the sides of the gate electrode 38, an N+-type source layer 41, a drain side field moderating layer 39 and an N+-type drain layer 40 are formed.

In an EEPROM having this kind of construction, in the memory transistor, the embedded N-type layer 32 is formed before the floating gate electrode 35 is formed, and the source layer 42 is formed after the formation of the control gate electrode 37. Because of this, the channel length of a channel region between the embedded N-type layer 32 and the source layer 42 below the floating gate electrode 35 is not determined by self-alignment. Consequently, there has been the problem that dispersion tends to arise in the transistor characteristics.

Also, the floating gate electrode 35 and the control gate electrode 37 are formed above the embedded N-type layer 32 of the memory transistor. Therefore, because the region where the embedded N-type layer 32 and the floating gate electrode 35 overlap is large, the parasitic capacitance between the floating gate electrode 35 and the drain region is large. Consequently, there has been the problem that the overwriting speed is low.

To ameliorate these problems, the kind of technology shown in FIG. 20 has been proposed (JP-A-58-115865 and JP-A-59-205763). An EEPROM of the construction shown in FIG. 20, compared to the construction shown in FIG. 19, has the floating gate electrode 35 and the control gate electrode 37 removed above the drain region of the memory transistor. And, a drain side field moderating layer 43 is formed in the superficial layer of the semiconductor substrate 31 below the region where the floating gate electrode 35 and the control gate electrode 37 have been removed.

With this technology, in the memory transistor, by ion implantation with the floating gate electrode 35 and the control gate electrode 37 used as a mask, the field moderating layer 43 on the drain region side and the source layer 42 can be formed using self-alignment. Consequently, channel length dispersion can be suppressed and dispersion in the transistor characteristics can be reduced. And, compared to the construction of FIG. 19, because the region where the floating gate electrode 35 and the drain region overlap can be reduced, the parasitic capacitance between the floating gate electrode 35 and the drain region can be lowered. By this means, the overwriting speed can be increased.

However, even with the technology shown in FIG. 20, there are the following problems. In the EEPROM manufacturing process, the floating gate electrode 35 and the control gate electrode 37 are formed as follows. First, a first polysilicon layer to constitute the floating gate electrode 35 is formed on the tunnel film 34 and the gate oxide film 33. Then, on an interlayer insulating layer on that, a second polysilicon layer to constitute the control gate electrode 37 is formed. And after that, the floating gate electrode 35, the interlayer insulating film 36 and the control gate electrode 37 are formed by etching the first polysilicon layer, the interlayer insulating layer and the second polysilicon layer simultaneously.

Thus, in the manufacture of the EEPROM shown in FIG. 20, a special working step of etching the three layers that are the first polysilicon layer, the interlayer insulating layer and the second polysilicon layer simultaneously is necessary.

And, the gate electrode of the select transistor also has a three-layer structure, made up of a first polysilicon layer 44, an interlayer insulating layer 45 and a second polysilicon layer 46. Consequently, there has been the problem that, to obtain electrical connection between the first polysilicon layer 44 forming the gate electrode and an external electrode, it is necessary to add a working step of forming a hole in the interlayer insulating layer 45 and the second polysilicon layer 46 above the first polysilicon layer 44.

And, when as shown in FIG. 20 the floating gate electrode 35 and the control gate electrode 37 are formed above only a part of the region of the tunnel film 34, at the time of the above-mentioned working of the three-layers, because the tunnel film 34 is exposed, etching damage is done to the tunnel film 34. Consequently, the problem arises that deterioration of the tunnel film 34 occurs and the overwriting life of the device falls.

And, when the three layers that are the first polysilicon layer, the interlayer insulating layer and the second polysilicon layer are etched simultaneously, the end faces of the interlayer insulating film 36 become exposed. When etching damage from the working mentioned above remains on these exposed end faces, the problem arises that, because the charge of the floating gate electrode 35 escapes through these damaged end faces, the charge holding characteristic deteriorates.

SUMMARY OF THE INVENTION

It is therefore an object of the present invention to provide a superior EEPROM and a manufacturing method thereof. It is an another object of the present invention to provide a EEPROM and a manufacturing method thereof with which it is possible to suppress reduction of overwriting life and deterioration of charge holding characteristic while reducing dispersion of memory transistor characteristics and reducing parasitic capacitance.

A memory transistor of the EEPROM according to the present invention has a drain region comprised of an embedded layer and a drain side field moderating layer. A floating gate electrode is formed not to cover the drain side field moderating. As a result, the region where the drain region and the floating gate electrode 8 overlap is small. Therefore, the parasitic capacitance between the floating gate electrode and the drain region can be reduced.

A floating gate electrode is formed to have a gate length approximately equal to a length of a channel region between the drain region and a source region. These drain region and source region are formed self-aligningly by ion implantation with the floating gate electrode used as a mask. As a result, dispersion of the channel length can be suppressed, and therefore dispersion of memory transistor characteristics can be reduced.

Also, the floating gate entirely is formed to cover a tunnel film formed in a gate insulating film above the embedded layer. Therefore, at the time of etching for forming the floating gate electrode, the tunnel film 6 does not become exposed. By this means, the tunnel film can be prevented from suffering etching damage. Thus, it is possible to reduce deterioration of tunnel film quality and increase overwriting life.

An interlayer insulating film disposed between the floating gate electrode and a control gate electrode is formed to cover an upper face and side faces of the floating gate electrode. As a result, there are no etched end faces of the interlayer insulating film on the floating gate electrode. Therefore, because it is possible to prevent the charge of the floating gate electrode from escaping through the end faces, good charge holding characteristics can be obtained.

These and other features and advantages of the present invention will become more apparent upon reading the following detailed description and upon reference to the accompanying drawings.

DETAILED DESCRIPTION OF THE PREFERRED EMBODIMENTS (First Preferred Embodiment)

Figure 1:
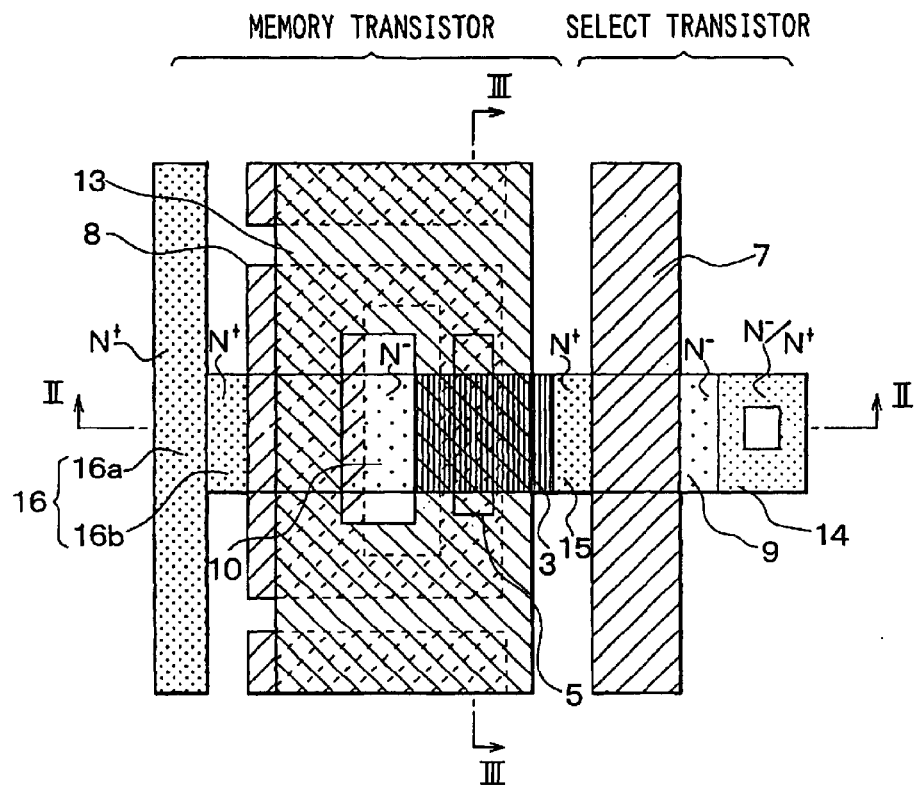
FIG. 1 is a plan view of an EEPROM of a first embodiment of the invention.
Figure 2:
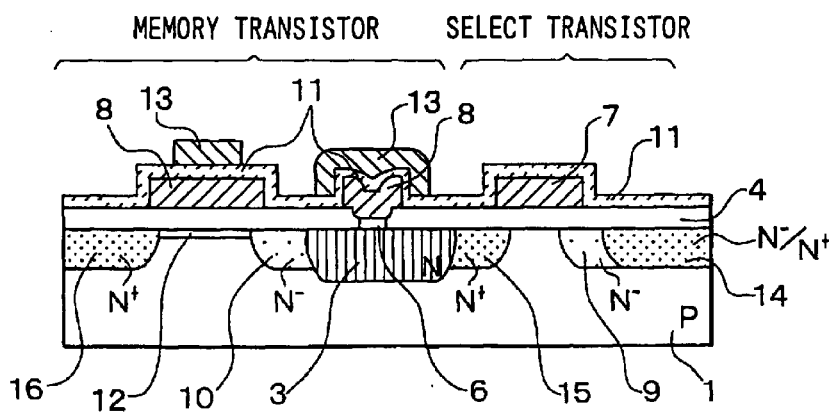
FIG. 2 is a sectional view along the line II—II in FIG. 1.
Figure 3:
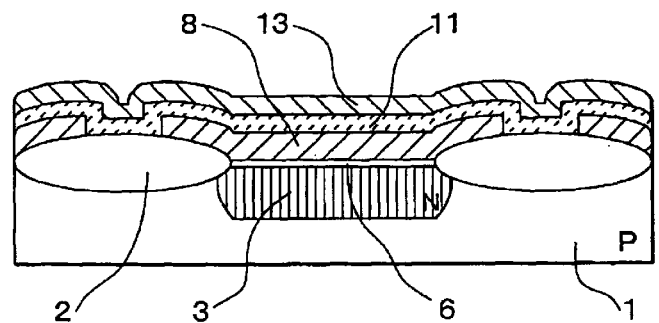
FIG. 3 is a sectional view along the line III—III in FIG. 1.

A plan view of an EEPROM of a first preferred embodiment of the invention is shown in FIG. 1, a sectional view along the line II—II in FIG. 1 is shown in FIG. 2, and a sectional view along the line III—III in FIG. 1 is shown in FIG. 3. The hatching in FIG. 1 has been added to show different regions.

The EEPROM of this preferred embodiment has a memory transistor and a select transistor.

In the memory transistor region, as shown in FIG. 2, an N-type embedded layer 3 and an N$^-$-type drain side field moderating layer 10 and an N$^+$-type source leadout layer 16 are formed in a superficial layer of a P-type semiconductor substrate 1 made of silicon. A tunnel film 6 is formed above the embedded layer 3, and a gate oxide film 4 is formed on the rest of the surface of the semiconductor substrate 1. A floating gate electrode 8 is formed on the tunnel film 6 and on the region between the field moderating layer 10 and the N$^+$-type source leadout layer 16. The region on the underside of the floating gate electrode 8 and between the field moderating layer 10 and the N$^+$-type source leadout layer 16 is a channel region 12. A control gate electrode 13 is formed on an interlayer insulating film 11 on the floating gate electrode 8.

Explaining this in more detail, the embedded layer 3 has an impurity concentration of for example $1\times10^{18}$ cm$^{-3}$ or over. The tunnel film 6, as shown in FIG. 2, is disposed where a part of the gate oxide film 4 above the embedded layer 3 has been removed. That is, the tunnel film 6 is narrower than the width of the embedded layer 3 in the left-right direction in FIG. 1. In FIG. 1, the region 5 is the region where the tunnel film 6 is formed, and hereinafter this will be referred to as the tunnel window 5.

The opening area of this tunnel window 5 is an important structural factor for determining the overwriting characteristics in the nonvolatile memory, and in this preferred embodiment, as shown in FIG. 3, the length of the tunnel window 5 in the up-down direction of FIG. 1 is regulated by a thick oxide film 2 for element separation. Consequently, the construction is such that area variation of the tunnel window 5 is small and dispersion in the overwriting characteristics can be reduced.

The floating gate electrode 8 is made of polysilicon. As shown in FIGS. 1 and 2, above the tunnel window 5 the floating gate electrode 8 is wider than the tunnel window 5 and covers the tunnel window 5 completely. Above the field moderating layer 10, the floating gate electrode 8 has an opening in a region facing the field moderating layer 10, and the shape of the floating gate electrode 8 is such that it does not cover the field moderating layer 10. And, of the floating gate electrode 8, the end faces above the channel region 12 have a shape such that the $N^+$-type source leadout layer 16 and the field moderating layer 10 can be formed using self-alignment. The floating gate electrode 8 is shown with hatching in FIG. 1, and of this region the part shown with dashed lines is positioned under the control gate electrode 13.

The $N^-$-type drain side field moderating layer 10 has an impurity concentration of for example $1.0 \times 10^{18}$ cm$^{-3}$ or under, and is formed adjacent to the embedded layer 3 to provide voltage durability of the drain region. In this preferred embodiment, this field moderating layer 10 and the embedded layer 3 constitute the drain region.

The $N^+$-type source leadout layer 16 has an impurity concentration of for example $5.0 \times 10^{19}$ cm$^{-3}$ or over, and is made up of a leadout layer 16a extending in the up-down direction in FIG. 1 and an $N^+$-type layer 16b positioned between the leadout layer 16a and the floating gate electrode 8. The field moderating layer 10 and the $N^+$-type layer 16b are formed self-aligningly in regions of the superficial layer of the semiconductor substrate 1 at the sides of the floating gate electrode 8, by ion implantation with the floating gate electrode 8 as a mask.

The interlayer insulating film 11 consists of for example an ONO (Oxide Nitride Oxide) film, and as shown in FIG. 2 is disposed over the entire surface of the semiconductor substrate 1 including the top face and side faces of the floating gate electrode 8 above the tunnel film 6 and the channel region 12.

The control gate electrode 13 is made of polysilicon. As shown in FIGS. 1 and 2, above the tunnel window 5 the control gate electrode 13 is at least wider than the floating gate electrode 8 and is of a shape such that it wraps the floating gate electrode 8. This wrapping shape is such that the control gate electrode 13 also covers the side faces of the floating gate electrode 8.

Above the channel region 12, in the left-right direction in FIG. 1, the control gate electrode 13 is narrower than the floating gate electrode 8; in other words, the end parts of the control gate electrode 13 are set back from the end parts of the floating gate electrode 8. And, the control gate electrode 13 is of such a shape that it does not cover the field moderating layer 10 or the $N^+$-type source leadout layer 16.

On the other hand, in the select transistor, as shown in FIG. 2, a gate electrode 7 made of polysilicon is formed on the gate oxide film 4 on the semiconductor substrate 1. And in the superficial layer of the semiconductor substrate 1, an $N^+$-type source layer 15, an $N^-$-type drain side field moderating layer 9 and an $N^-/N^+$-type double diffusion drain layer 14 are formed in regions located at the sides of the gate electrode 7.

The $N^+$-type source layer 15 is adjacent to the embedded layer 3 and by this means the memory transistor and the select transistor are connected. The $N^-/N^+$-type double diffusion drain layer 14 is a layer formed by both the conductive impurity constituting the $N^-$-type drain side field moderating layer 9 and the conductive impurity constituting the $N^+$-type source layer 15.

The interlayer insulating film 11 of the memory transistor extends into the select transistor and is formed over the whole region of the select transistor including the surface of the gate electrode 7.

Next, a method for manufacturing the EEPROM of this preferred embodiment will be described. FIGS. 4A through 8D illustrate manufacturing steps. FIGS. 4A through 4D, FIGS. 5A through 5C and FIGS. 6A through 6C are sectional views along the line II—II in FIG. 1, and FIGS. 7A through 7C and FIGS. 8A through 8D are sectional views along the line III—III in FIG. 1.

Figure 4A:
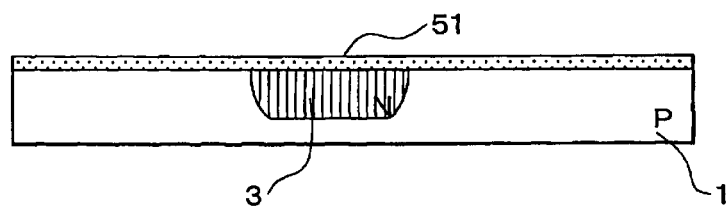
FIGS. 4A through 4D are views showing manufacturing steps of an EEPROM of the first preferred embodiment, and area sectional views along the line II—II in FIG. 1.
Figure 7A:
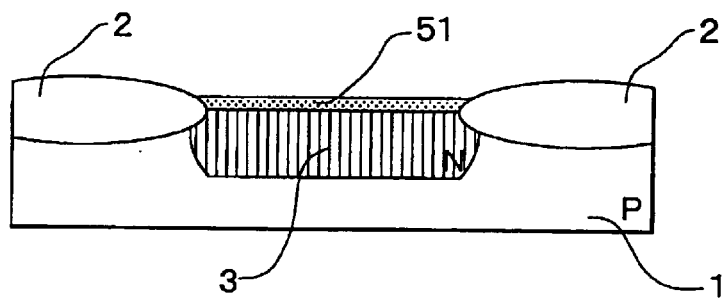
FIGS. 7A through 7D are views showing manufacturing steps of an EEPROM of the first preferred embodiment, and are sectional views along the line III—III in FIG. 1.

(Step Shown in FIG. 4A and FIG. 7A)

For example by LOCOS, a thick oxide film 2 is formed only on a region of the surface of a P-type silicon semiconductor substrate 1 to become an element separation layer. Then, a sacrificial oxide layer 51 is formed on the surface of the semiconductor substrate 1. Through this sacrificial oxide layer 51 at least phosphorus ions or arsenic ions are implanted locally, and heat-treatment is carried out. By this means, an $N^+$-type embedded layer 3 is formed.

Figure 4B:
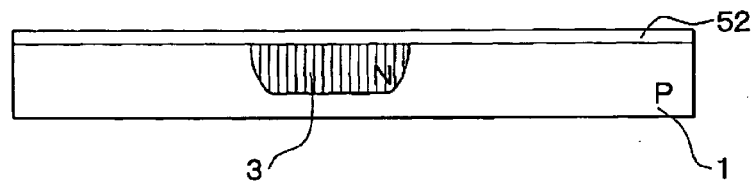
Figure 7B:
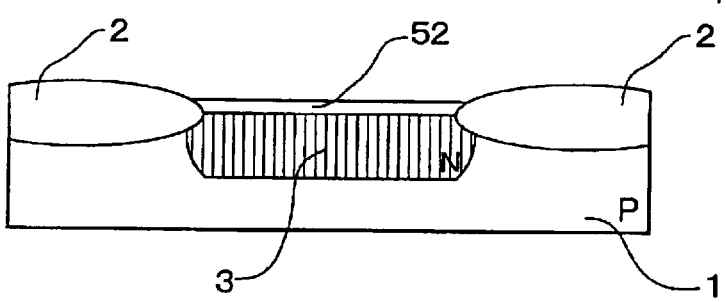

(Step Shown in FIG. 4B and FIG. 7B)

The sacrificial oxide layer 51 is removed, and an oxide film 52 to become a gate oxide film 4 of the memory transistor and the select transistor is formed.

Figure 4C:
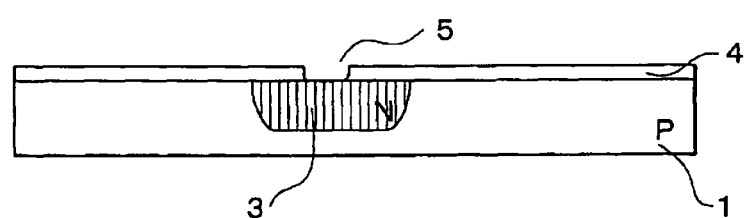
Figure 7C:
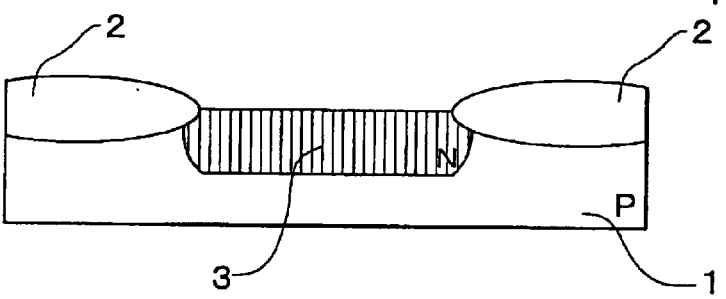

(Step Shown in FIG. 4C and FIG. 7C)

In a region where the memory transistor is to be formed, of the gate oxide film 52, a part above the $N^+$-type embedded layer 3 is removed by for example a wet process which causes little damage. By this means, a tunnel window 5 narrower than the embedded layer 3 in the left-right direction in FIG. 1 is formed. At this time, with regard to the shape of the tunnel window 5, although the width in the line II—II direction in FIG. 1 may vary due to over-etching or the like, the width in the line III—III direction is regulated by the edge of the thick oxide film 2, as shown in FIG. 7C. Consequently, shape dispersion of the tunnel window 5 can be reduced. In this step, the oxide film 52 takes the same shape as the gate oxide film 4 in FIG. 2.

Figure 4D:
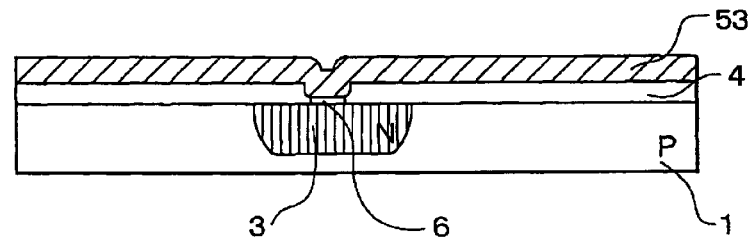
Figure 7D:
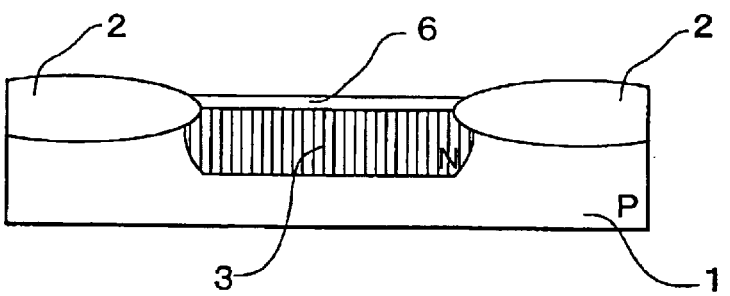

(Step Shown in FIG. 4D and FIG. 7D)

In the tunnel window 5, a thin oxide film of film thickness 9 nm is formed for example by wet oxidation on the surface of the semiconductor substrate 1, and then nitriding and reoxidation are carried out. By this means, a tunnel film 6 is formed in the tunnel window 5. Then, a first layer polysilicon film 53 of for example phosphorus concentration $1.0 \times 10^{20}$ cm$^{-3}$ and film thickness 200 nm is formed on the gate oxide film 4 including the top of the tunnel film 6.

Figure 5A:
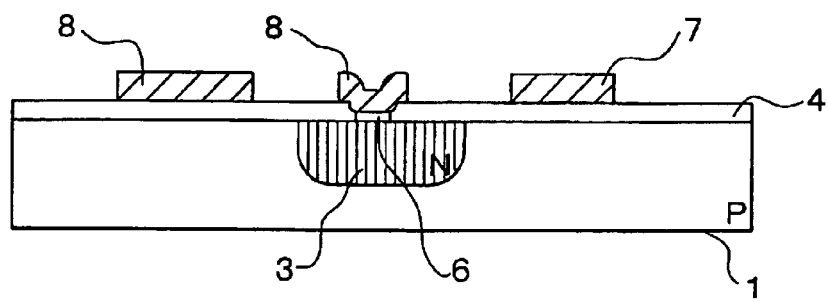
FIGS. 5A through 5C are views showing manufacturing steps following on from FIG. 4D.
Figure 8A:
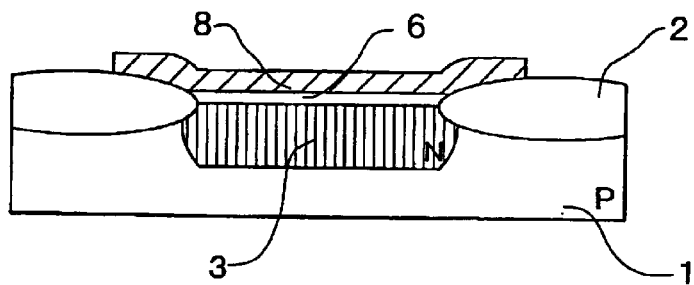
FIGS. 8A through 8D are views showing manufacturing step following on from FIG. 7D.

(Step Shown in FIG. 5A and FIG. 8A)

Photolithography is carried out on the first layer polysilicon film 53. Specifically, photoresist is formed on the first layer polysilicon film 53, and the photoresist is patterned. And with the patterned photoresist as a mask, the first layer polysilicon film 53 is for example dry etched.

In this preferred embodiment, at this time, the first layer polysilicon film 53 is etched to a shape such that above the tunnel window 5 it is wider than the width of the tunnel window 5 and above an $N^-$-type drain side field moderating layer 10 (see FIG. 2) of the memory transistor, to be formed later, it has an opening. In other words, the first layer polysilicon film 53 is patterned to a shape such that it covers the whole of the tunnel window 5 but does not cover the region where ion implantation for forming the field moderating layer 10 is to be carried out. The region where ion implantation for forming the field moderating layer 10 is to be carried out is the region between the channel forming region and the embedded layer 3. In this way, a floating gate electrode 8 is formed above the channel forming region and above the tunnel film 6.

And, by the first layer polysilicon film 53 being etched, at the same time as the floating gate electrode 8 is formed, a gate electrode 7 of the select transistor is formed.

When the gate electrode 7 and the floating gate electrode 8 are each formed by etching a polysilicon film in a separate step, if there were to be a positional deviation of a mask, dispersion would arise in the distance between the gate electrode 7 and the floating gate electrode 8. In contrast to this, in the present preferred embodiment, because the gate electrode 7 and the floating gate electrode 8 are formed simultaneously, even if there is a positional deviation of the mask, the distance between the floating gate electrode 8 of the memory transistor and the gate electrode 7 of the select transistor can be kept highly accurate. Consequently, a nonvolatile memory structure capable of dense integration can be obtained.

In this step the first layer polysilicon film 53 is etched so that the shapes of the floating gate electrode 8 and the gate electrode 7 assume shapes such that in a later step an impurity diffusion layer can be formed self-aligningly by ion implantation with the floating gate electrode 8 and the gate electrode 7 as a mask.

After the first layer polysilicon film 53 is etched, a photoresist for that etching is removed.

Figure 5B:
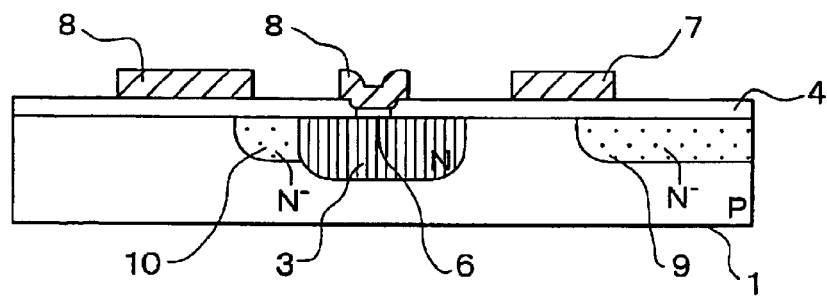

(Step Shown in FIG. 5B)

Although it is not shown in the figures, the source formation region of the memory transistor and the source formation region of the select transistor are covered with a mask, and using the gate electrode 7 and the floating gate electrode 8 as masks, implantation of for example phosphorus (P) ions is carried out. After that, heat-treatment is carried out. By this means, an N⁻-type drain side field moderating layer 9 of the select transistor and an N⁻-type drain side field moderating layer 10 of the memory transistor are formed self-aligningly.

In this way it is possible to reduce drain side dispersion of the channel lengths of the select transistor and the memory transistor. And, because the N⁻-type field moderating layer 9 and the N⁻-type field moderating layer 10 are formed simultaneously under the same ion implantation conditions, compared to when these are formed in separate steps, the manufacturing process can be simplified.

In this step, because the conductive impurity is diffused by the ion implantation and heat-treatment, as shown in FIG. 5B the field moderating layer 10 and the floating gate electrode 8 overlap slightly.

And, the section along the line III—III in FIG. 1 after this step is the same as the state shown in FIG. 8A.

Figure 5C:
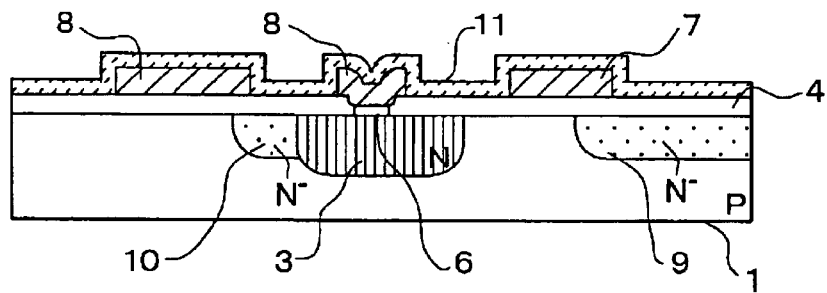
Figure 8B:
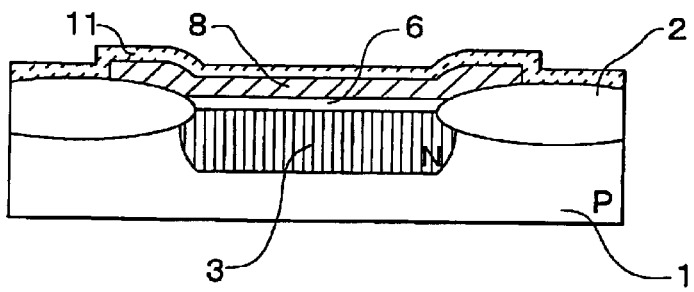

(Step Shown in FIG. 5C and FIG. 8B)

For example by overall CVD (Chemical Vapor Deposition), an interlayer insulating film 11 consisting of an ONO film of oxide film equivalent film thickness 20 nm is formed over the whole of the select transistor and the memory transistor.

Figure 6A:
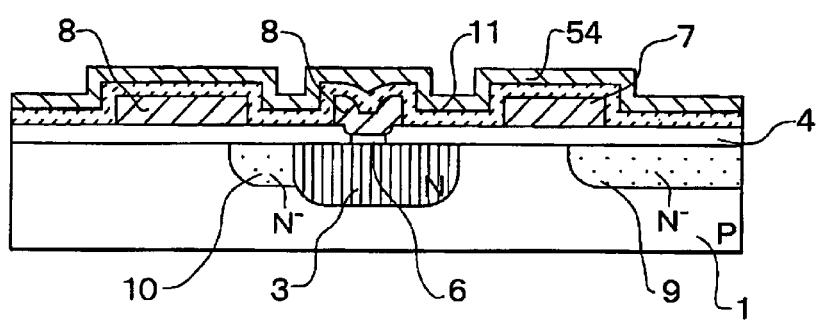
FIGS. 6A through 6C are views showing manufacturing steps following on from FIG. 5C.
Figure 8C:
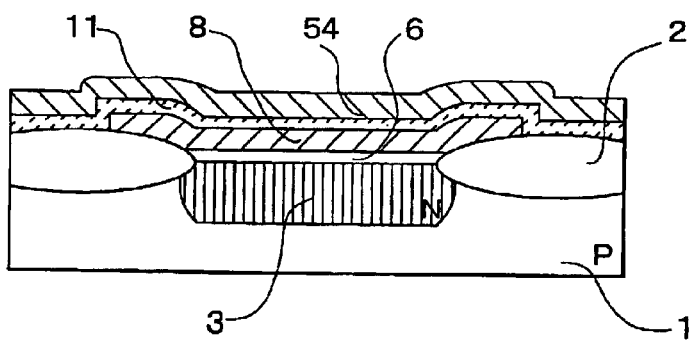

(Step Shown in FIG. 6A and FIG. 8C)

A second layer polysilicon film 54 is formed on the interlayer insulating film 11.

Figure 6B:
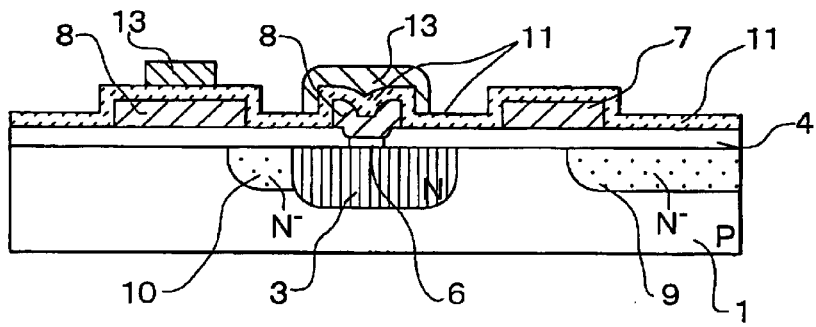
Figure 8D:
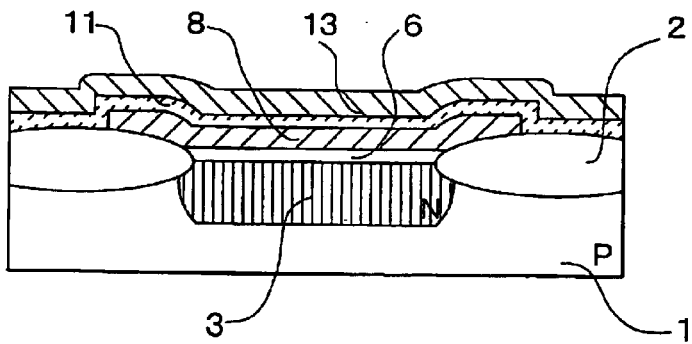

(Step Shown in FIG. 6B and FIG. 8D)

Photolithography is carried out on the second layer polysilicon film 54. Specifically, photoresist is formed on the second layer polysilicon film 54, and the photoresist is patterned. And with the patterned photoresist as a mask, the second layer polysilicon film 54 is for example dry etched.

At this time, in this preferred embodiment, the second layer polysilicon film 54 is etched so that above the tunnel film 6 it is wider than the floating gate electrode 8 and wraps the floating gate electrode 8 interposing the interlayer insulating film 11 therebetween. And, above the region where the channel of the memory transistor is to be formed, the second layer polysilicon film 54 is etched to a shape narrower than the floating gate electrode 8, and above the N⁻-type drain side field moderating layer 10 of the memory transistor it is etched to a shape such that it does not cover this field moderating layer 10. In this way, a control gate electrode 13 consisting of the second layer polysilicon film is formed.

When the second layer polysilicon film 54 is etched, the second layer polysilicon film 54 and the upper layer oxide film of the ONO film constituting the interlayer insulating film 11 are etched selectively. Because the second layer polysilicon film 54 is worked by an etching method having selectivity with respect to the upper layer oxide film in the ONO film as described above, the structure becomes one in which the whole region is covered by an ONO film made up of a lower layer oxide film, a nitride film and an upper layer oxide film.

In this preferred embodiment, the subsequent manufacturing steps are carried out with the whole substrate covered by this ONO film including a nitride film. Consequently, in addition to variation of device characteristics caused by mobile ions entering from outside such as alkali ions in subsequent steps and after the device is completed, deterioration in charge holding life can also be suppressed.

Figure 20:
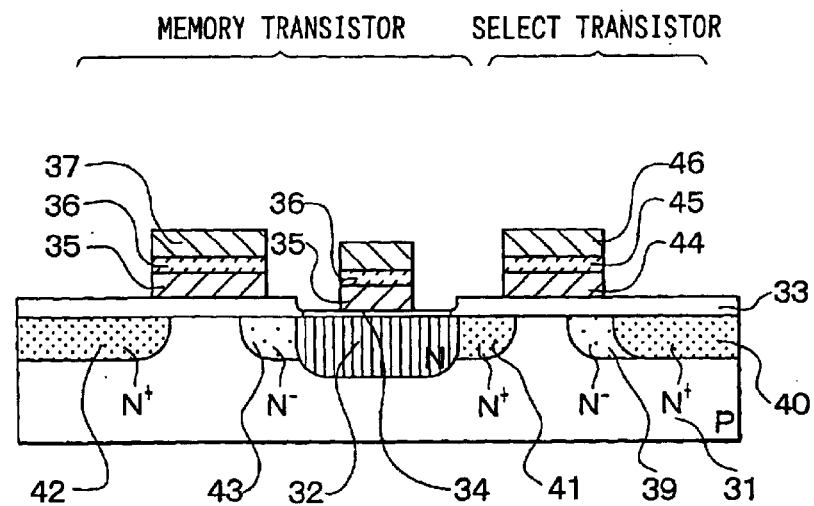
FIG. 20 is a sectional view of a second example of an EEPROM of related art.

As shown in FIG. 20, when a second layer polysilicon film 46 is formed on a gate electrode 44, to electrically connect the gate electrode 44 to an external electrode, after the gate electrode 44 and the second layer polysilicon film 46 are formed, a separate step of forming a hole in the second layer polysilicon film 46 is necessary.

In contrast to this, in the present preferred embodiment, at the time of the etching of the second layer polysilicon film 54, the second layer polysilicon film 54 is removed in the region where the select transistor is to be formed. Because the gate electrode 7 of the select transistor is made a one-layer structure like this, compared to when a second layer polysilicon film 46 is formed on a gate electrode 44, an additional step for electrically connecting an external electrode to the gate electrode is unnecessary.

Figure 6C:
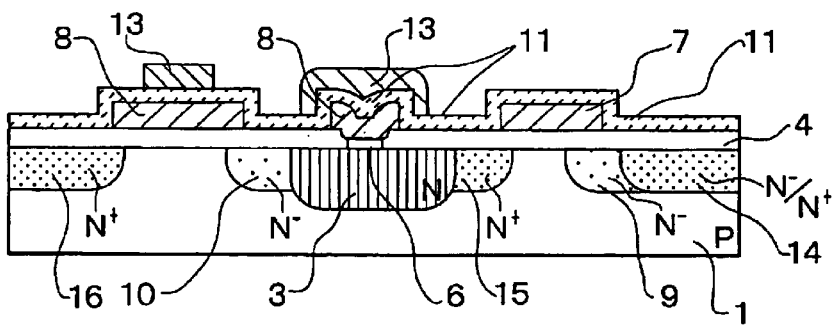

(Step Shown in FIG. 6C)

For example arsenic (As) ions are implanted into the source formation region of the memory transistor and the source formation region of the select transistor, using the floating gate electrode 8 and the gate electrode 7 as masks. By this means, an N⁺-type source lead out layer 16 of the memory transistor and an N⁺-type source layer 15 of the select transistor are formed self-aligningly. At this time, simultaneously in the select transistor formation region, part of the field moderating layer 9 is covered with a mask while the ion implantation is carried out. As a result, an N⁻/N⁺-type double diffusion drain layer 14 is formed.

By this step, in the memory transistor, a channel region 12 is formed in the superficial layer of the semiconductor substrate 1. The channel length of the memory transistor is regulated highly precisely by the field moderating layer 10 and the N⁺-type source leadout layer 16, which were formed self-aligningly. And, at the same time, in the select transistor, a channel region is formed under the gate electrode 7 between the N+-type source layer 15 and the drain side field moderating layer 9, and this channel length is also regulated highly precisely. Consequently, dispersion of characteristics can be reduced greatly in both transistors. By going through these steps, it is possible to manufacture the EEPROM shown in FIG. 1 through FIG. 3.

In the EEPROM of this preferred embodiment, for example, by injecting electrons from the N+-type embedded layer 3 into the floating gate electrode 8 using a Fowler Nordheim tunnel current generated by impressing a high voltage on the control gate electrode 13, erasing of memory information is carried out. And, by drawing electrons from the floating gate electrode 8 to the N+-type embedded layer 3 using a Fowler Nordheim tunnel current generated by impressing a high voltage on the N+-type embedded layer 3, information is written to the memory.

Some characteristic features of the construction of the EEPROM of this preferred embodiment will be summarized below.

In the memory transistor, of the drain region, parts of the embedded layer 3 and the field moderating layer 10 are not covered by the floating gate electrode 8. That is, the floating gate electrode 8 has an opening so that the field moderating layer 10 can be formed. And the N−-type drain side field moderating layer 10 is formed self-aligningly by ion implantation using the floating gate electrode 8 of the shape described above as a mask. Consequently, the drain side dispersion of the channel length of the memory transistor regulated by the ends of the N−-type drain side field moderating layer 10 and the N+-type source leadout layer 16 in the memory transistor can be reduced.

And, above the channel region 12, the control gate electrode 13 is narrower than floating gate electrode 8, and does not cover the N+-type source leadout layer 16. The N+-type source leadout layer 16 is formed by ion implantation using the floating gate electrode 8 as a mask after the field moderating layer 10 and the control gate electrode 13 are formed in turn. At this time, because the floating gate electrode 8 is covered by the interlayer insulating film 11, which is an ONO film, its shape does not change in the oxidation step after the interlayer insulating film 11 is formed.

Because of this, the N+-type source leadout layer 16 is formed self-aligningly using end faces of the floating gate electrode 8 which do not vary in shape. Consequently, source side dispersion of the channel length is low.

Figure 19:
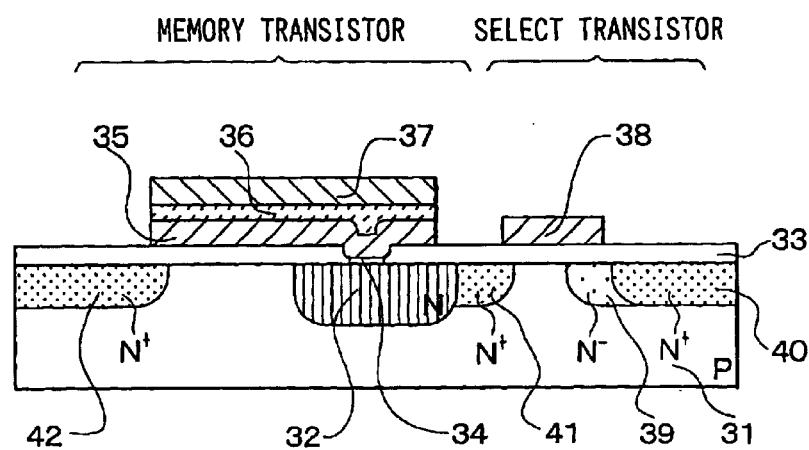
FIG. 19 is a sectional view of a first example of an EEPROM of related art.

From the above, with this preferred embodiment, compared to an EEPROM of a construction such as that shown in FIG. 19 wherein the whole drain region is covered by the floating gate, dispersion of the channel length of the memory transistor can be reduced and dispersion of the transistor characteristics can be reduced.

And, because the field moderating layer 10 is not covered by the floating gate electrode 8 and the control gate electrode 13, compared to a construction such as that shown in FIG. 19 wherein the whole drain region is covered by the floating gate electrode and the control gate electrode, of the gate oxide film 4, the region sandwiched between the drain region and the floating gate electrode 8 is small. That is, the region where the drain region and the floating gate electrode 8 overlap is small. Therefore, the parasitic capacitance between the floating gate electrode and the drain region can be made smaller than in a structure wherein the whole drain region is covered by the floating gate electrode and the control gate electrode. As a result, the overwriting time can be shortened.

The state of the field moderating layer 10 not being covered by the floating gate electrode 8 referred to in this specification is not limited to the state of the field moderating layer 10 being completely not covered. It also includes states wherein the field moderating layer 10 and the floating gate electrode 8 overlap slightly in the vicinity of the channel region 12 due to the field moderating layer 10 having been formed self-aligningly.

And, in an EEPROM of a construction such as that shown in FIG. 19 wherein the whole drain region is covered by the floating gate electrode and the control gate electrode, the gate oxide film 4 above the drain region deteriorates under the high voltage impressed on the drain region during writing to the memory. In contrast to this, in the present preferred embodiment, because the region where the gate oxide film 4 is sandwiched between the drain region and the floating gate electrode 8 is small, deterioration of the gate oxide film 4 caused by the high voltage impressed on the drain region during writing to the memory can be suppressed.

And, in this preferred embodiment, the floating gate electrode 8 is shaped wider than the tunnel film 6. Therefore, at the time of the etching of the first layer polysilicon film 53 for forming the floating gate electrode 8, the tunnel film 6 does not become exposed and remains covered by the first layer polysilicon film 53 as the first layer polysilicon film 53 is etched. By this means, the tunnel film 6 can be prevented from suffering etching damage. Thus it is possible to reduce deterioration of tunnel film quality and increase overwriting life.

Above the tunnel window 5, the control gate electrode 13 is wider than the floating gate electrode 8 and is shaped to wrap the floating gate electrode 8. And, above the channel region 12 of the memory transistor the control gate electrode 13 is shaped narrower than the floating gate electrode 8.

In the EEPROM of this preferred embodiment, the end faces of the floating gate electrode 8 and the end faces of the control gate electrode 13 are thus in different positions. That is, the working of polysilicon films for forming the floating gate electrode 8 and the control gate electrode 13 is carried out separately. And, the working of the polysilicon film for forming the control gate electrode 13 is carried out with the interlayer insulating film 11 covering the upper face and side faces of the floating gate electrode 8. In the completed EEPROM, the interlayer insulating film 11 covers the upper face and side faces of the floating gate electrode 8.

Consequently, the etched end faces of the interlayer insulating film arising when the floating gate electrode 8 and the control gate electrode 13 are worked simultaneously in related art, which had been a cause of charge dissipation, do not exist. And as a result, with this preferred embodiment, good charge holding characteristics can be obtained.

Although in this preferred embodiment a case wherein the interlayer insulating film 11 covers the whole of the memory transistor and the select transistor has been described, as long as it is of a shape such that no etched end faces arise, it does not necessarily have to cover the whole region. That is, it is sufficient if the interlayer insulating film 11 covers at least the upper face and the side faces of the floating gate electrode 8. In this case also, compared to an EEPROM of a construction having etched end faces of the interlayer insulating film above the floating gate electrode 8, good charge holding characteristics can be obtained.

Here, the reason for making the shape of the control gate electrode 13 a different shape above the tunnel window 5 from above the channel region 12 will be explained. When above the channel region 12 the control gate electrode 13 is made to wrap the floating gate electrode 8 as it does above the tunnel window 5, the control gate electrode 13 is present on the interlayer insulating film 11 above the field moderating layer 10. This is undesirable because, since the distance between the field moderating layer 10 and the control gate electrode 13 is small, the $N^-$-type field moderating layer 10 suffers an influence of the high voltage impressed on the control gate electrode 13 at the time of memory erasing.

To avoid this, in the present preferred embodiment, above the channel region 12, the control gate electrode 13 is shaped so that the ends of the control gate electrode 13 are set back from the ends of the floating gate electrode 8. By this means it is possible to suppress the influence on the $N^-$-type field moderating layer 10 of the high voltage impressed on the control gate electrode 13 at the time of memory erasing.

And, above the tunnel window 5, the upper face of the floating gate electrode 8 has a depression and is not flat. Because of this, it is not desirable for the control gate electrode 13 to be formed to a shape narrower than the floating gate electrode 8 and with the end parts of the control gate electrode 13 set back from the end parts of the floating gate electrode 8, as it is above the channel region 12.

Accordingly, in this preferred embodiment, above the tunnel window 5, the control gate electrode 13 is shaped to be wider than the floating gate electrode 8 and to wrap the floating gate electrode 8.

And, in this preferred embodiment, the drain side field moderating layer 9 of the select transistor and the drain side field moderating layer 10 of the memory transistor are formed simultaneously and under the same ion implantation conditions.

When the gate electrode of the select transistor is ON, the withstandable voltage is determined by the field moderating layer formed in the drain region of the memory transistor. On the other hand, when the gate electrode is OFF, the withstandable voltage is determined by the field moderating layer formed in the drain region of the select transistor.

Therefore, in this preferred embodiment, because the field moderating layer formed in the drain region of the select transistor and the field moderating layer formed in the drain region of the memory transistor are of the same ion composition and ion concentration, the withstandable voltage of the EEPROM can be kept constant.

(Second Preferred Embodiment)

Figure 9:
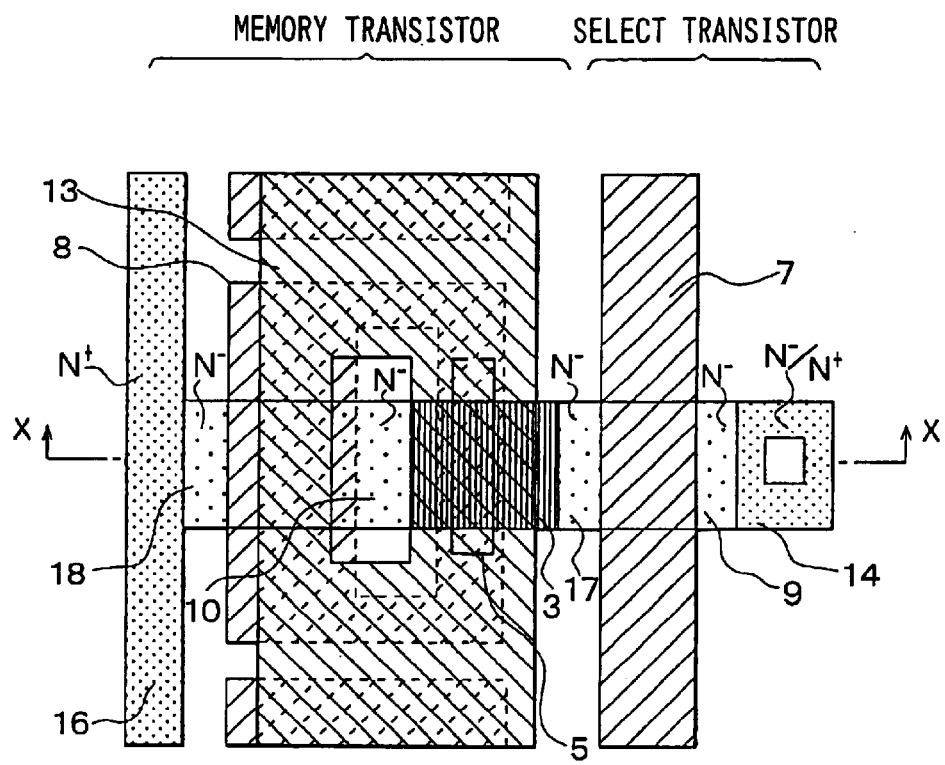
FIG. 9 is a plan view of an EEPROM of a second preferred embodiment of the invention.
Figure 10:
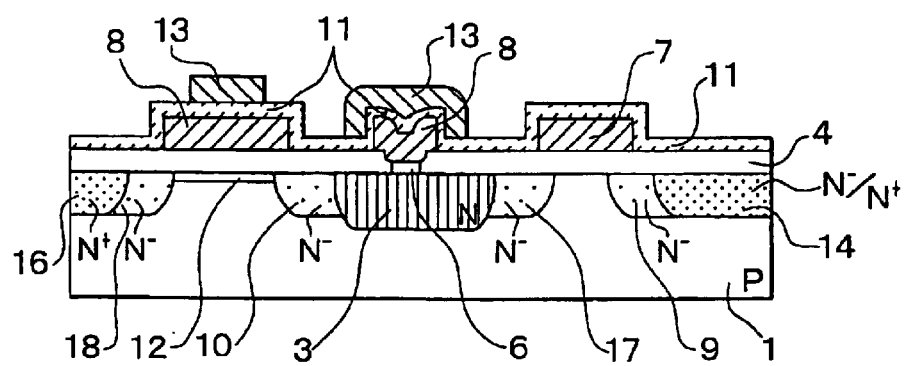
FIG. 10 is a sectional view along the line X—X in FIG. 9.

A plan view of an EEPROM of a second preferred embodiment is shown in FIG. 9, and a sectional view along the line X—X in FIG. 9 is shown in FIG. 10. Parts the same as parts in the first preferred embodiment have been assigned the same reference numerals as in the first preferred embodiment and will not be described again here.

In this preferred embodiment, as shown in FIG. 9 and FIG. 10, an $N^-$-type source side leadout part 18 and an $N^+$-type source leadout layer 16 connecting to the $N^-$-type source side leadout part 18 are formed in the source region of the memory transistor. And, in the source region of the select transistor, an $N^-$-type layer 17 is formed in place of the $N^+$-type source layer 15 in the first preferred embodiment.

The $N^-$-type source side leadout part 18 and the $N^-$-type layer 17 have impurity concentrations lower than the $N^+$-type source leadout layer 16 and the $N^+$-type source layer 15, and their concentrations are for example $1.0 \times 10^{18}$ $cm^{-3}$ or below. In this preferred embodiment, the $N^-$-type source side leadout part 18 and the $N^-$-type layer 17 function as field moderating layers.

Next, a method for manufacturing the EEPROM of this preferred embodiment will be described. The manufacturing process is illustrated in FIGS. 11A and 11B and FIGS. 12A through 12C. These figures are sectional views along the line X—X in FIG. 9. Here, points of difference from the first preferred embodiment will be explained.

First, in the same way as in the first preferred embodiment, the steps shown in FIG. 4A through FIG. 5A are carried out to form a floating gate electrode 8 of a memory transistor and a gate electrode 7 of a select transistor on a semiconductor substrate 1. Then, the step illustrated in FIG. 11A is carried out.

Figure 11A:
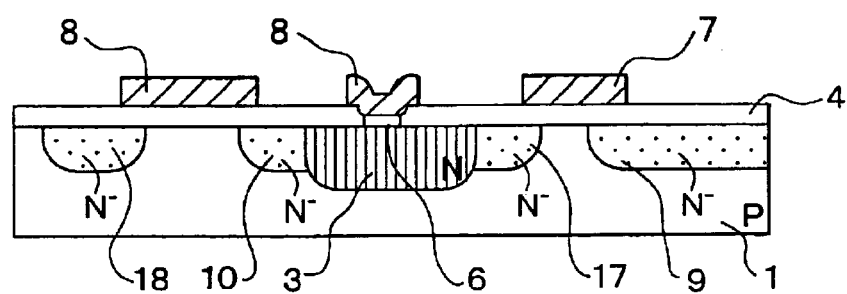
FIGS. 11A and 11B are views showing manufacturing steps of an EEPROM of the second preferred embodiment, and are sectional views along the line X—X in FIG. 9.

(Step Shown in FIG. 11A)

In this step, ion implantation is carried out using the gate electrode 7 and the floating gate electrode 8 as masks. By this means, an $N^-$-type drain side field moderating layer 9 and an $N^-$-type source side layer 17 of the select transistor and an $N^-$-type drain side field moderating layer 10 and an $N^-$-type source side layer 18 of the memory transistor are formed self-aligningly. Because as a result of this the channel lengths of the select transistor and the memory transistor are regulated with high accuracy, dispersion of the characteristics of both of the transistors can be greatly reduced.

And, the $N^-$-type drain side field moderating layer 9 and the $N^-$-type source side layer 17 of the select transistor and the $N^-$-type drain side field moderating layer 10 and the $N^-$-type source side layer 18 of the memory transistor are formed simultaneously. As a result of this, compared to a case wherein the $N^-$-type drain side field moderating layer 9 of the select transistor and the $N^-$-type source side layers 17 and 18 are formed in separate steps from the field moderating layer 10 of the memory transistor, the number of manufacturing steps can be cut.

Figure 11B:
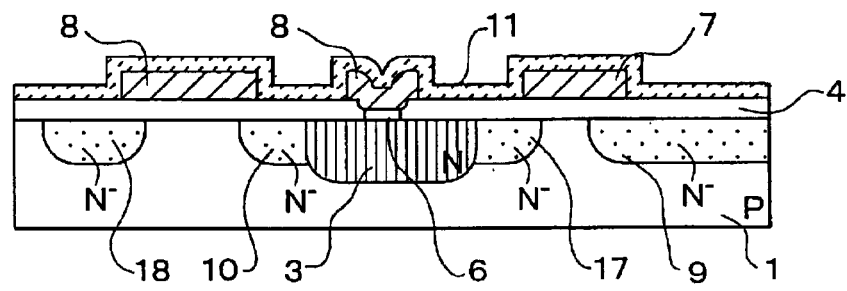
Figure 12A:
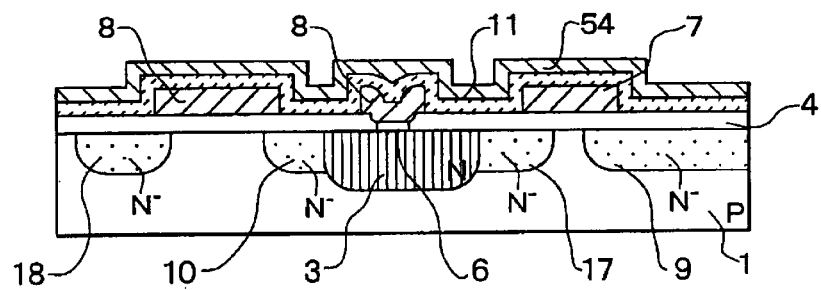
FIGS. 12A through 12C are views showing manufacturing steps following on from FIG. 11B.
Figure 12B:
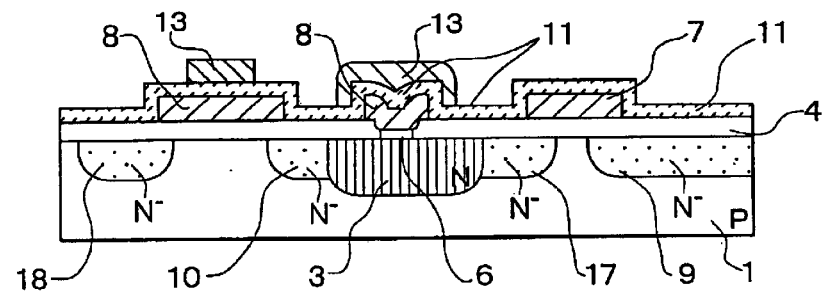

(Steps Shown in FIG. 11B and FIGS. 12A, 12B)

In these steps, in the same way as in the steps shown in FIG. 5C and FIGS. 6A and 6B, an interlayer insulating film 11 and a control gate electrode 13 are formed.

Figure 12C:
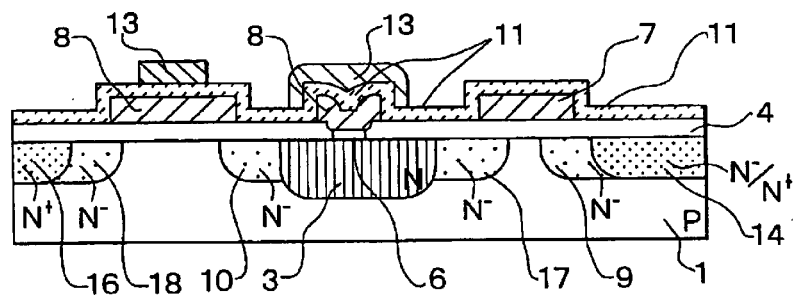

(Step Shown in FIG. 12C)

Ion implantation is carried out with the floating gate electrode 8, the control gate electrode 13, the $N^-$-type source side layer 18 and the field moderating layer 10 of the memory transistor and the $N^-$-type layer 17 and a part of the field moderating layer 9 of the select transistor covered with a mask. By this means, in the source region of the memory transistor an $N^+$-type source leadout layer 16 is formed in a position away from the end of the floating gate electrode 8, and in the drain region of the select transistor an $N^-/N^+$-type double diffusion drain layer 14 is formed in a position away from the end of the gate electrode 7. By going through these steps it is possible to manufacture the EEPROM shown in FIG. 9 and FIG. 10.

To summarize some characteristic features of the EEPROM construction of this preferred embodiment, first, at the same time as the formation of the $N^-$-type drain side field moderating layer 10 of the memory transistor the $N^-$-type source side leadout part 18 and the $N^-$-type layer 17 of the select transistor are formed self-aligningly using the end faces of the floating gate electrode 8 and the gate electrode 7.

As a result of this, because the channel length of the memory transistor is regulated by the self-aligningly formed $N^-$-type drain side field moderating layer 10 and $N^-$-type source side leadout part 18, dispersion is extremely low.

Also, because in the memory transistor the drain and source regions both have a low-concentration field moderating layer 10, 18, the field acting on the gate oxide film 4 is lowered and the gate oxide film 4 can be made thin. And by making the gate oxide film 4 thin like this, it is possible to increase the drive capability of the memory transistor.

And, as shown by FIG. 2 in the first preferred embodiment, when the source region of the memory transistor is made up of an $N^+$-type source leadout layer 16$a$ and an $N^+$-type layer 16$b$ of a high concentration, in the formation of the $N^+$-type source leadout layer 16$a$ and the $N^+$-type layer 16$b$ there is a risk of high-concentration N-type ions being implanted into the floating gate electrode 8 and the resistance of the floating gate electrode 8 consequently changing locally. And, there is also a risk of implantation of high-concentration N-type ions causing the gate oxide film 4 above the source region to deteriorate.

In contrast to this, in this preferred embodiment, the $N^-$-type leadout part 18, which has a lower concentration than the $N^+$-type source leadout layer 16$a$ and the $N^+$-type layer 16$b$, is formed near the end of the floating gate electrode 8, and the $N^+$-type source leadout layer 16 is formed in a position away from the end of the floating gate electrode 8. This $N^+$-type source leadout layer 16 is formed after the $N^-$-type source side leadout part 18 is formed, by forming a mask so as to cover the top of the floating gate electrode 8 and the $N^-$-type source side leadout part 18 and carrying out ion implantation using this mask.

Therefore, in the forming of the $N^+$-type source leadout layer 16, high-concentration N-type ions can be prevented from being implanted into the floating gate electrode 8, and local resistance variation of the floating gate electrode 8 can be suppressed. And, of the source region, because high-concentration N-type ions are not implanted in the source side end vicinity of the floating gate electrode 8, the gate oxide film 4 at the source side end vicinity of the floating gate electrode 8 can be prevented from suffering damage during the high-concentration N-type ion implantation. By this means it is possible to suppress deterioration of the gate oxide film 4.

Similarly also in the source region of the select transistor, when the $N^+$-type source layer 15 is formed as in the first preferred embodiment, there is a risk of the resistance of the gate electrode 7 varying locally and of the gate oxide film deteriorating as a result of the implantation of high-concentration N-type ions to form this $N^+$-type source layer 15.

With respect to this also, in this preferred embodiment, because the $N^-$-type layer 17 is formed in the source region of the select transistor, local resistance variation of the gate electrode 7 resulting from the implantation of high-concentration N-type ions can be suppressed. And, deterioration of the gate oxide film 4 above the source region can be suppressed.

Although in this preferred embodiment an example has been described wherein an $N^-$-type leadout part 18 of the memory transistor and an $N^-$-type layer 17 of the select transistor are both formed, with respect to the first preferred embodiment, either one of the $N^-$-type source side leadout part 18 and the $N^-$-type layer 17 may be alternatively formed.

(Third Preferred Embodiment)

Figure 13:
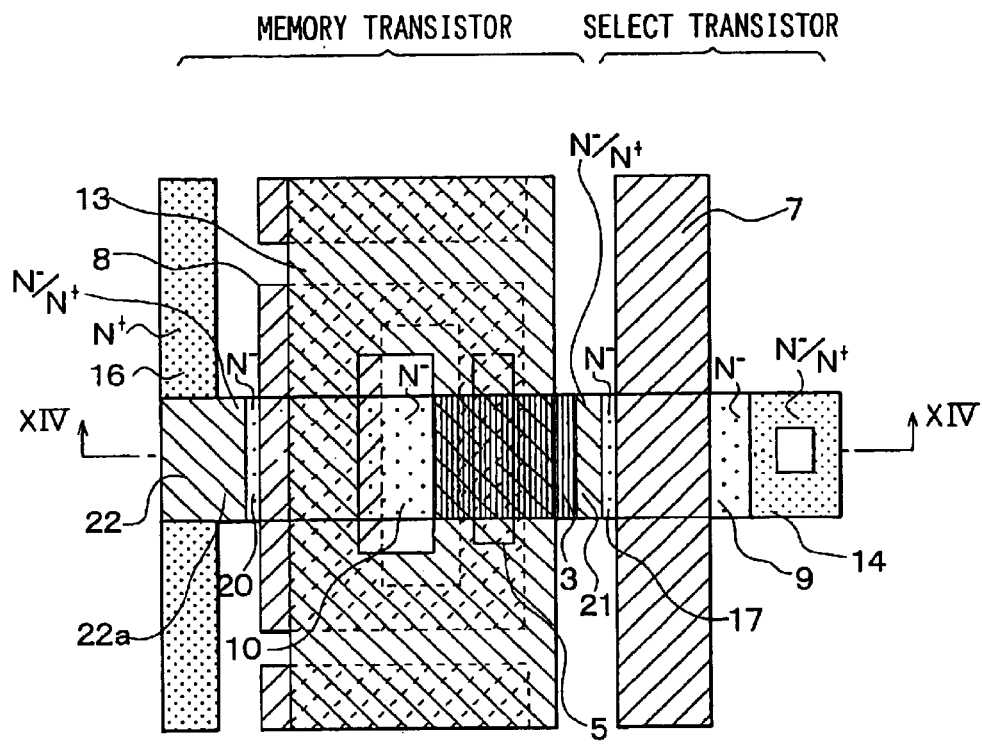
FIG. 13 is plan view of an EEPROM of a third preferred embodiment of the invention.
Figure 14:
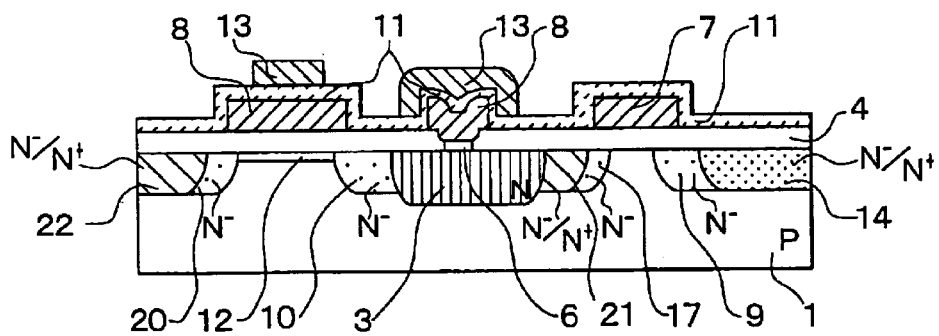
FIG. 14 is a sectional view along the line XIV—XIV in FIG. 13.

A plan view of an EEPROM of a third preferred embodiment of the invention is shown in FIG. 13 and a sectional view along a line XIV—XIV in FIG. 13 is shown in FIG. 14. In this preferred embodiment also, parts the same as parts in the first and second preferred embodiments have been given the same reference numerals and will not be described again.

The main differences between the EEPROM of this preferred embodiment and that of the second preferred embodiment are the point that an $N^-/N^+$ double diffusion source layer 22 is formed so that the source region of the memory transistor has an offset structure and the point that an $N^-/N^+$ double diffusion source layer 21 is formed so that the source region of the select transistor has an offset structure.

Specifically, as shown in FIG. 13 and FIG. 14, an $N^-$-type layer 20 and an $N^-/N^+$ double diffusion source layer 22 are formed in the superficial layer of the semiconductor substrate 1 in the source region of the memory transistor.

The $N^-$-type layer 20, like the $N^-$-type leadout part 18 in FIG. 10 of the second preferred embodiment, is formed self-aligningly by ion implantation with the floating gate electrode 8 as a mask.

The $N^-/N^+$ double diffusion source layer 22 is disposed in a position away from the end of the floating gate electrode 8. And, as shown in FIG. 13, an $N^+$-type source leadout layer 16 extending in the up-down direction in the figure is connected to the $N^-/N^+$ double diffusion source layer 22. The $N^-/N^+$ double diffusion source layer 22 has a portion 22$a$ disposed between the $N^+$-type source leadout layer 16 and the floating gate electrode 8 in the left-right direction in FIG. 13.

And, an $N^-$-type layer 17 and an $N^-/N^+$ double diffusion source layer 21 are formed in the superficial layer of the semiconductor substrate 1 in the region of the select transistor. The $N^-/N^+$ double diffusion source layer 21 is disposed, in the region where the $N^-$-type layer 17 is formed in FIG. 10, away from the source side end part of the gate electrode 7 and adjacent to the embedded layer 3.

A method for manufacturing the EEPROM of this preferred embodiment will now be described. FIGS. 15A and 15B and FIGS. 16A through 16C illustrate manufacturing steps. The steps illustrated in FIGS. 15A and 15B and FIGS. 16A through 16C respectively correspond to the steps illustrated in FIGS. 11A and 11B and FIGS. 12A through 12C in the second preferred embodiment.

Figure 15A:
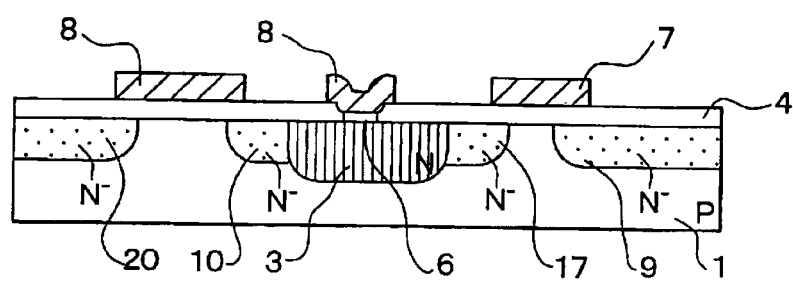
FIGS. 15A and 15B are views showing manufacturing steps of an EEPROM of the third preferred embodiment, and are sectional views along the line XIV—XIV in FIG. 13.
Figure 15B:
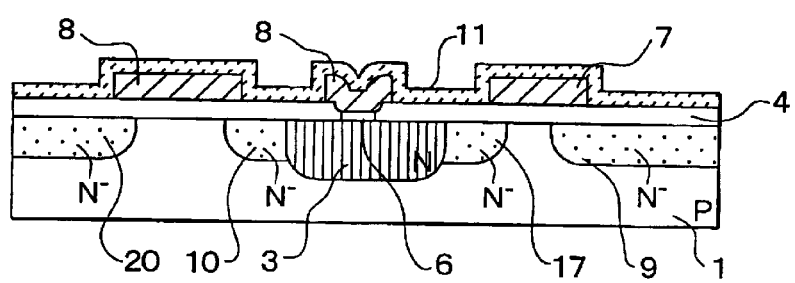

In the step shown in FIG. 15A, differently from the N-type source side leadout part 18 in FIG. 11A, an $N^-$-type layer 20 is formed to a shape such that it is disposed as far as the region where the $N^+$-type source leadout layer 16 is to be formed. After that, the steps shown in FIGS. 15B and 15C and FIGS. 16A and 16B are carried out in the same way as in the second preferred embodiment.

Figure 16A:
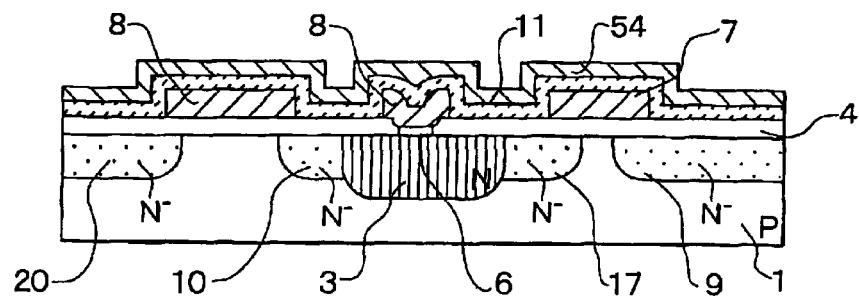
FIGS. 16A through 16C are views showing manufacturing steps following on from FIG. 15B.
Figure 16B:
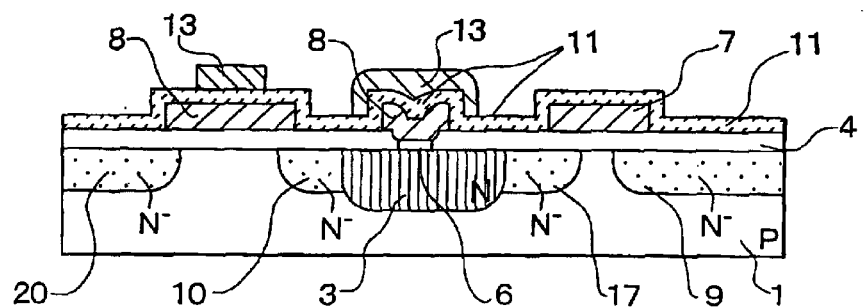
Figure 16C:
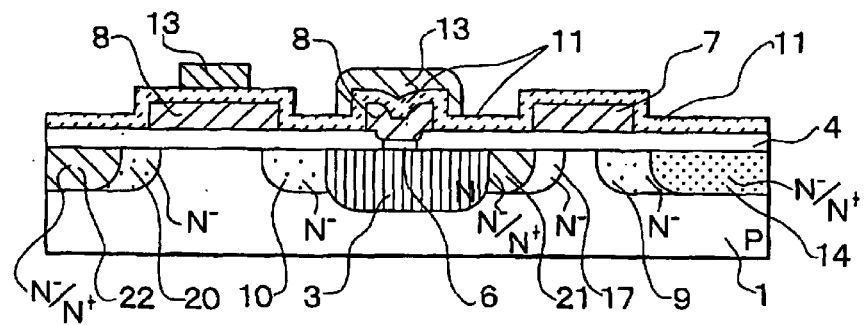

In the step shown in FIG. 16C, in the region where the source of the memory transistor is to be formed, with the floating gate electrode 8 and part of the $N^-$-type layer 20 covered with a mask, and also in the region where the source of the select transistor is to be formed, with the gate electrode 7 and part of the $N^-$-type layer 17 covered with a mask, for example As (Arsenic) ions are implanted to a high concentration. At this time, with respect to the $N^-$-type layer 20 of the memory transistor and the $N^-$-type layer 17 of the select transistor formed self-aligningly, ions are implanted in regions away from the end faces of the floating gate electrode 8 and the gate electrode 7. It is to be noted that the floating gate electrode 8 side end of this region is positioned between the $N^+$-type source leadout layer 16 and the floating gate electrode 8 in the second preferred embodiment.

In this way, the $N^-/N^+$ double diffusion source layer 21 of the select transistor and the $N^-/N^+$ double diffusion source layer 22 of the memory transistor are formed. These double diffusion source layers are regions where As (Arsenic) ions have been further implanted into regions where P (Phosphorus) ions implanted to form field moderating layers as described above exist. By this means, source regions of an offset structure are formed.

And, in this step, by the high-concentration ion implantation, the N⁻/N⁺-type double diffusion drain layer 14 of the select transistor and the N⁺-type source leadout layer 16 are also formed simultaneously. In this way, the EEPROM shown in FIGS. 13 and 14 is manufactured.

In this preferred embodiment, the source region of the memory transistor is made up of the N⁻-type layer 20 and the N⁻/N⁺ double diffusion source layer 22, and also the source region of the select transistor is made up of the N⁻-type layer 17 and the N⁻/N⁺ double diffusion source layer 21. As a result of the N⁻-type layers 17, 20 being provided, as explained with respect to the second preferred embodiment, because no high-concentration ions are implanted into the floating gate electrode 8 of the memory transistor and the gate electrode 7 of the select transistor, local resistance variation of the floating gate electrode 8 and the gate electrode 7 can be suppressed and the film quality of the gate oxide film 4 in the transistors is ensured and this film can be made thin.

And, when the bit information in the memory transistor selected by the select transistor is to be read, particularly, when a written bit is to be read, a current flows between the drain region of the select transistor and the source region of the memory transistor. With this preferred embodiment, as shown in FIG. 13, in the region where in FIG. 9 the N⁻-type source side leadout part 18 and the N⁻-type layer 17 were formed, the N⁻/N⁺ double diffusion source layer 22 and the N⁻/N⁺ double diffusion source layer 21 are formed. Therefore, compared to a structure lacking the N⁻/N⁺ double diffusion source layer 22 and the N⁻/N⁺ double diffusion source layer 21 like the second preferred embodiment, the loss of current flowing when written bits are being read can be reduced. As a result, because it is not necessary to perform superfluous writing, an improvement in overwriting life can be achieved.

Next, the effect of the improvement in tunnel film quality, which determines the overwriting life, the most important characteristic of an EEPROM, will be discussed. The results of comparing the film qualities obtained by steady current TDDB measurement of the tunnel films in a memory device according to this preferred embodiment and a related art memory device having a sectional structure shown in FIG. 20 are shown in FIG. 17 and FIG. 18.

These results were obtained using a memory structure TEG (Test Element Group) with interconnections formed on the floating gate electrodes of two types of memory devices of the present preferred embodiment and related art to enable a potential to be applied to the floating gate electrode. In the EEPROM of the present preferred embodiment used in the steady current TDDB measurement, the N⁺-type embedded layer 3 was formed by implanting phosphorus ions and arsenic ions to $6 \times 10^- \text{cm}^{-2}$ and $2 \times 10^{14} \text{cm}^{-2}$ respectively and performing a heat-treatment of 1000° C., 60 minutes in a nitrogen atmosphere, the gate oxide film 4 was formed by wet oxidation to a film thickness of 35 nm, and the thickness of the tunnel film 6 was made 9 nm.

Figure 17:
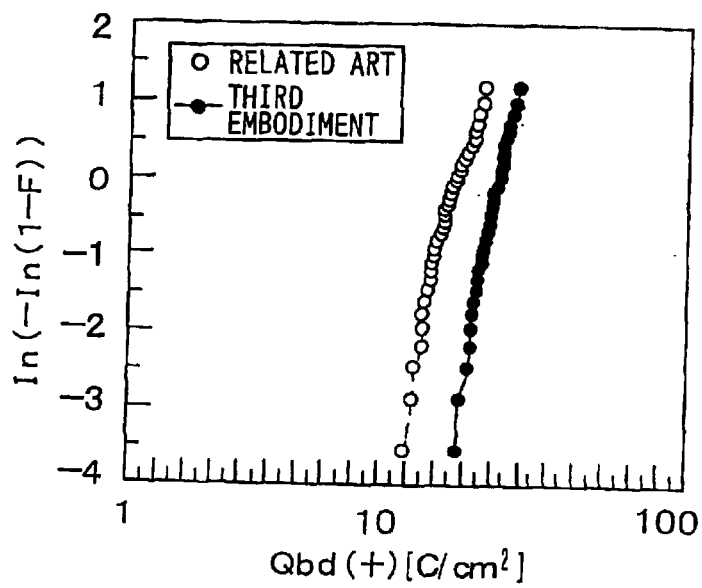
FIG. 17 is a graph showing results of steady current TDDB measurement (positive gate bias) on erasing, for an EEPROM of the construction of the third preferred embodiment shown in FIG. 14 and an EEPROM of the construction of related art shown in FIG. 20.
Figure 18:
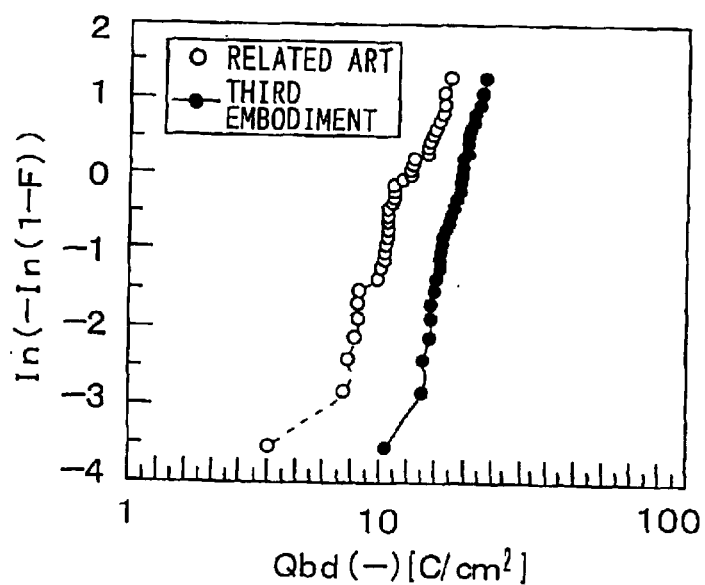
FIG. 18 is a graph showing results of steady current TDDB measurement (negative gate bias) on writing, for an EEPROM of the construction of the third preferred embodiment shown in FIG. 14 and an EEPROM of the construction of related art shown in FIG. 20.

FIG. 17 shows the comparison results of tunnel film breakdown overall charge at the time of erasing of the memory (positive gate bias), and FIG. 18 shows comparison results of tunnel film breakdown overall charge at the time of writing to the memory (negative gate bias). As is clear from FIG. 17 and FIG. 18, in tunnel films formed under the same conditions, in both erasing and writing, the present preferred embodiment shows better results than the related art construction. And it can be seen that with the EEPROM and manufacturing method thereof of this preferred embodiment, as described above, it is possible to obtain a nonvolatile memory having low dispersion of characteristics, long overwriting life and charge holding life, and high overwriting speed.

Although in this preferred embodiment an example was described wherein the source regions of both the memory transistor and the select transistor had an offset structure, alternatively only one or the other of the source region of the memory transistor and the source region of the select transistor can be given an offset structure.

(Other Preferred Embodiments)

Although in the foregoing preferred embodiments examples were described wherein the interlayer insulating film 11 was made an ONO film, the interlayer insulating film does not have to be an ONO film and can alternatively be made some other film having a nitride layer.

What is claimed is:

1. An EEPROM having a memory transistor, said memory transistor comprising:

a drain region of a second conductivity type formed in a superficial layer of a semiconductor substrate of a first conductivity type, said drain region including an embedded layer and a drain side field moderating layer formed adjacent to said embedded layer;

a source region of the second conductivity type in the superficial layer of said semiconductor substrate;

a channel region between said drain region and said source region;

a gate insulating film formed on a surface of said semiconductor substrate;

a tunnel film formed in a part of said gate insulating film above said embedded layer;

a floating gate electrode formed above said tunnel film and said channel region and having a shape such that it has a size enough to cover said tunnel film and has a gate length approximately equal to a length of said channel region between said drain region and said source region;

an interlayer insulating film covering an upper face and side faces of said floating gate electrode; and a control gate electrode formed above said floating gate electrode interposing said interlayer insulating film therebetween, wherein said control gate electrode is shaped to be wider than said floating gate electrode and to wrap said floating gate electrode above said tunnel film and is shaped to be narrower than said floating gate electrode above said channel region.

2. An EEPROM having a memory transistor, said memory transistor comprising:

a drain region of a second conductivity type formed in a superficial layer of a semiconductor substrate of a first conductivity type, said drain region including an embedded layer and a drain side field moderating layer formed adjacent to said embedded layer;

a source region of the second conductivity type in the superficial layer of said semiconductor substrate;

a channel region between said drain region and said source region;

a gate insulating film formed on a surface of said semiconductor substrate;

a tunnel film formed in a part of said gate insulating film above said embedded layer;

a floating gate electrode formed above said tunnel film and said channel region and having a shape such that it has a size enough to cover said tunnel film and has a gate length approximately equal to a length of said channel region between said drain region and said source region;

an interlayer insulating film covering an upper face and side faces of said floating gate electrode; and a control gate electrode formed above said floating gate electrode interposing said interlayer insulating film therebetween wherein said floating gate electrode and said control gate electrode each have an opening and the position of the opening in the control gate electrode offsets toward said channel region so that said control gate electrode wraps said floating gate electrode above said tunnel film and is narrower than said floating gate electrode above said channel region.

3. An EEPROM of a floating gate type and a two-layer polysilicon type having a memory transistor and a select transistor for selecting said memory transistor, said memory transistor comprising:

an embedded layer of a second conductivity type formed in a superficial layer of a semiconductor substrate of a first conductivity type;

a drain side field moderating layer of the second conductivity type formed adjacent to said embedded layer in the superficial layer of said semiconductor substrate;

a source region of the second conductivity type in the superficial layer of said semiconductor substrate;

a channel region between said drain side field moderating layer and said source region;

a gate insulating film formed on a surface of said semiconductor substrate;

a tunnel film formed in a part of said gate insulating film above said embedded layer;

a floating gate electrode formed above said tunnel film and said channel region and having a shape such that it entirely covers said tunnel film and covers neither said source region nor said drain side field moderating layer;

an interlayer insulating film covering an upper face and side faces of said floating gate electrode; and a control gate electrode formed above said floating gate electrode interposing said interlayer insulating film therebetween, wherein said source region and said drain side field moderating layer are self-aligningly formed by ion implantation using said floating gate electrode as a mask, and wherein said control gate electrode is shaped to be wider than said floating gate electrode and to wrap said floating gate electrode above said tunnel film and is shaped to be narrower than said floating gate electrode above said channel region.

4. The EEPROM as claimed in claim 3, wherein said select transistor has a gate electrode and a source region, the EEPROM further comprising a source side field moderating layer of the second conductivity type in at least one of source regions of said memory transistor and said select transistor, said source side field moderating layer being self-aligningly formed by ion implantation using said floating gate electrode or said gate electrode as a mask.

5. The EEPROM as claimed in claim 4, further comprising a source layer of the second conductivity type offset against said source side field moderating layer and having a higher concentration than said source side field moderating layer, so that at least one of said memory transistor and said select transistor has an offset type source structure.

6. The EEPROM as claimed in claim 3, wherein said select transistor has a gate electrode formed simultaneously with said floating gate electrode of said memory transistor from a first polysilicon layer.

7. The EEPROM as claimed in claim 3, wherein said select transistor has a drain side field moderating layer in a drain region, said drain side field moderating layer being formed simultaneously with said drain side field moderating layer of said memory transistor and self-aligningly by ion implantation using said gate electrode as a mask.

8. The EEPROM as claimed in claim 3, wherein said interlayer insulating film includes a nitride film and is formed on said semiconductor substrate including a surface of said gate electrode in a whole region of said select transistor and said memory transistor.

9. The EEPROM as claimed in claim 3, further comprising an insulation film for element separation formed on the surface of said semiconductor substrate, wherein a length of a region where said tunnel film is formed is regulated by said insulation film.

* * * * *